(12) United States Patent
Tomita et al.

(10) Patent No.: US 6,278,638 B1
(45) Date of Patent: Aug. 21, 2001

(54) PULSE GENERATOR CIRCUIT AND SEMICONDUCTOR MEMORY PROVIDED WITH THE SAME

(75) Inventors: Naoto Tomita, Yokohama; Hideo Kato, Kawasaki; Takafumi Ikeda, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/459,266

(22) Filed: Dec. 10, 1999

(30) Foreign Application Priority Data

Dec. 11, 1998 (JP) .................................................. 10-352912
Nov. 26, 1999 (JP) .................................................. 11-336311

(51) Int. Cl.$^7$ ...................................................... G11C 7/00
(52) U.S. Cl. ............................ 365/189.07; 365/189.09; 365/191; 365/204; 365/149
(58) Field of Search ........................ 365/189.01, 189.07, 365/189.05, 149, 191, 204

(56) References Cited

U.S. PATENT DOCUMENTS 5,197,030   3/1993   Akaogi et al. .
5,821,781   10/1998  Ragazio .

FOREIGN PATENT DOCUMENTS

| 360095771A | * | 5/1985 | (JP) . |
| 362040078A | * | 2/1987 | (JP) . |
| 362194723 | * | 8/1987 | (JP) . |
| 363294254 | * | 11/1988 | (JP) . |
| 402214324 | * | 8/1990 | (JP) . |
| 403064207A | * | 3/1991 | (JP) . |
| 7-245551 | | 9/1995 | (JP) . |
| 409116865A | * | 5/1997 | (JP) . |
| 410013196A | * | 1/1998 | (JP) . |

* cited by examiner

Primary Examiner—Viet Q. Nguyen
(74) Attorney, Agent, or Firm—Hogan & Hartson, LLP

(57) ABSTRACT

A pulse generator circuit provides a capacitor, a constant current source circuit for charging the capacitor at a constant current in response to an input signal, and a differential amplifier circuit for comparing a charge voltage in the capacitor with a predetermined reference voltage Vref, thereby outputting a pulse signal.

6 Claims, 6 Drawing Sheets

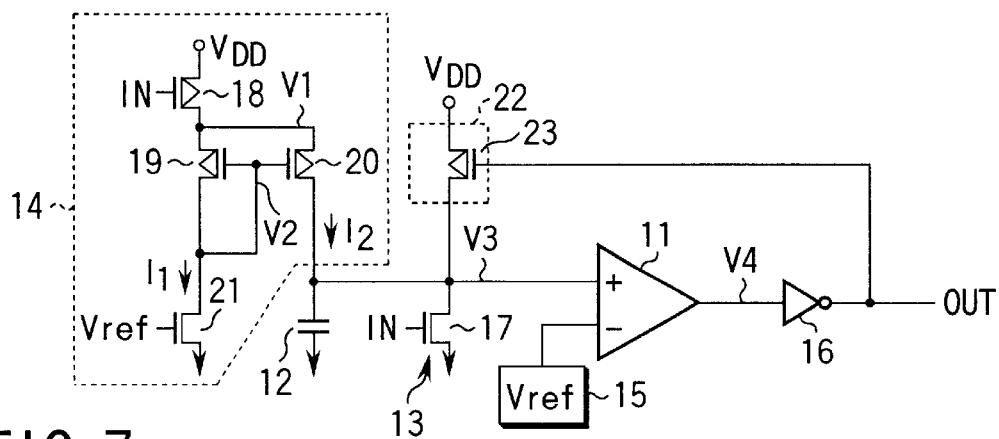
FIG. 7
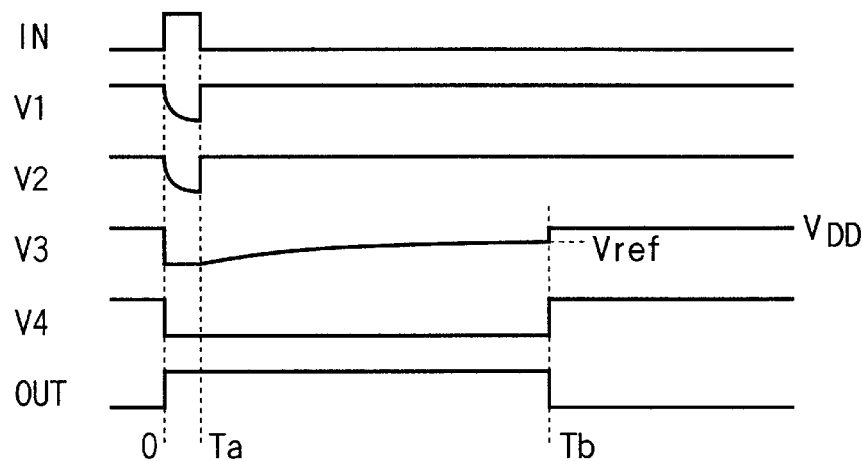
FIG. 8
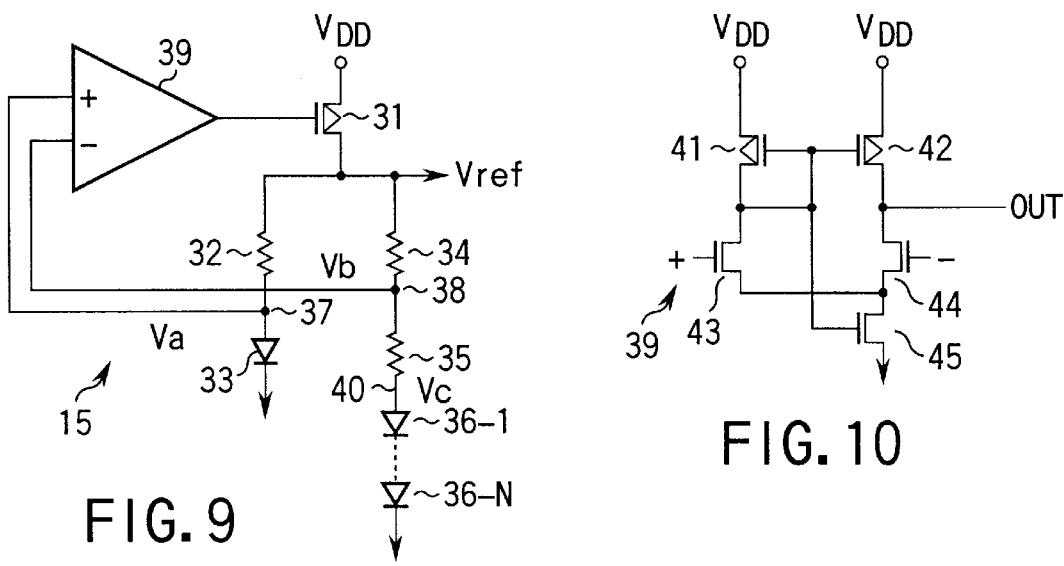
FIG. 9
FIG. 10

PULSE GENERATOR CIRCUIT AND SEMICONDUCTOR MEMORY PROVIDED WITH THE SAME

BACKGROUND OF THE INVENTION

The present invention relates to a pulse generator circuit for outputting a pulse signal of a predetermined pulse width in response to a trigger signal. In particular, the present invention relates to an improvement such that power voltage dependency of a pulse width of a pulse signal is eliminated.

In a semiconductor memory, a pulse signal generated by capturing an address change is employed as a trigger, thereby generating a timing signal of a constant pulse width, and controls the operation of each circuit incorporated in a memory.

FIG. 1 shows a configuration of a conventional pulse generator circuit for generating a pulse signal in response to a trigger signal. This circuit is composed of: the even number of inverters INV1 to INV6 (six inverters in this example) connected in cascade; capacitors C connected respectively between an output node of each inverter at an even-numbered stage excluding the last stage and a ground voltage node and between an output node of each inverter at an odd-numbered stage excluding the first stage and a power voltage node; P-channel transistors TP each having a source-drain path inserted between the power voltage node and the output node of an inverter provided at any even-numbered stage but the last-stage, and each having a gate connected to an output node of the first-stage inverter INV1; and N-channel transistors TN each having a source-drain path inserted between the ground voltage node and an output node of an inverter provided at any odd-numbered stage but the first stage, and each having a gate connected to an input node of a trigger signal.

FIG. 2 is a timing chart showing an example of operation of the pulse generator circuit shown in FIG. 1. In the figure, a trigger signal to be input to the inverter INV1 at the first stage is designated by IN; and signals of the output nodes of the inverters INV1 to INV6 at the first to last stages are designated by V1, V2, V3, V4, V5, and OUT, respectively.

Now, when the signal IN of a pulse width Ta is input, the signals V1, V2, V3, V4, V5, and OUT are initially set to L, H, L, H, L, and H, respectively.

Next, when the signal IN falls into an L level, the signal V1 of the output node of the inverter INV1 at the first stage rises from the initial L level to an H level immediately. Thereafter, a signal V2 of the output node of the inverter INV2 at a next stage starts its falling from the initial H level to the L level. However, a capacitor C is connected to its output node, and thus, its falling is gentle.

When the signal V2 becomes lower than a circuit threshold voltage of the inverter INV3 at a next stage at a time Tb, the signal V3 of the output node of this inverter INV3 starts its rising from the initial L level toward the H level. In this case also, the capacitor C is connected to its output node, and thus, its rising is gentle.

When the signal V3 becomes higher than a circuit threshold voltage of the inverter INV4 at a next stage at a time Tc, the signal V4 of the output node of this inverter INV4 starts its falling from the initial H level toward the L level. In this case also, its output node is connected to the capacitor C, and thus, its falling is gentle.

When the signal V4 becomes lower than a circuit threshold voltage of the inverter INV5 at a next stage, the signal V5 of the output node of this inverter INV5 starts its rising from the initial L level toward the H level. In this case also, the capacitor is connected to the output node of the inverter INV5, and thus, its rising is gentle.

When the signal V5 becomes higher than a circuit threshold voltage of the inverter INV6 at the last stage, the signal OUT of the output node of this inverter INV6 falls from the initial H level to the L level immediately.

That is, this pulse generator circuit outputs the signal OUT having a predetermined pulse width when a signal IN being a trigger signal is input. The pulse width of the output signal OUT is determined according to: a value of the capacitor C connected to each of the output nodes of the inverters INV2 to INV5; an element size of P-channel transistor and N-channel transistor constituting each inverter for charging and discharging the respective output nodes (N-channel transistors for the inverters INV2 and INV4 and P-channel transistors for the inverters INV3 and INV5); and a circuit threshold voltage of each inverter, in particular, a circuit threshold voltage of the inverters INV3 to INV6.

In the meantime, in the conventional circuit shown in FIG. 1, a circuit threshold voltage of each inverter or the current driving capacity of the P-channel and N-channel transistors which constitute each inverter varies depending on the value of the power voltage supplied to each inverter. Thus, the pulse width of the output signal OUT has power voltage dependency. For example, when the power voltage is shifted to be higher, the pulse width of the output signal OUT becomes shorter. Conversely, when the voltage is shifted to be lower, the pulse width becomes longer.

Also, assuming that such a pulse generator circuit is provided in a semiconductor memory to control operation of an internal circuit, in a state where a circuit, for example, an equalizing circuit or a latch circuit, is set to be prevented from malfunctioning even when a power voltage is high and a pulse width is short taking in consideration a power voltage dependency of a pulse width of a pulse signal generated at a pulse generating circuit, a pulse width of a pulse signal for controlling operation of the equalizing circuit or the latch circuit becomes long when the power voltage is lowered and the pulse width becomes longer. Thereby, such a problem as increased power consumption or the like will occur in a case that an access time is delayed or a power is lowered.

BRIEF SUMMARY OF THE INVENTION

The present invention has been made in view of the foregoing circumference. It is an object of the present invention to provide a pulse generator circuit capable of outputting a pulse signal having an always constant pulse width without power voltage dependency and a semiconductor memory provided with this pulse generator circuit.

According to the present invention, there is provided a pulse generator circuit comprising: a capacitor in which charging is performed; a charge control circuit for charging the capacitor at a constant current in response to a control signal; and a comparator circuit for comparing the charge voltage in the capacitor with a reference voltage and outputting a pulse signal based on the comparison result.

According to the present invention, there is provided a semiconductor memory comprising: a memory cell array having a memory cell; an address transition detector circuit for receiving address signals for selecting a memory cell of the memory cell array, detecting a switch of the address signals, and generating a pulse signal; a timing control circuit for generating a timing signal in response to a pulse signal generated by the address transition circuit; and a data detector circuit whose operation is controlled based on the timing signal generated by the timing control circuit, the data detector circuit detecting read-out data from the memory cell, wherein the timing control circuit comprises a capacitor in which charging is performed; a charge control circuit for charging the capacitor at a constant current in response to the pulse signal; and a comparator circuit for comparing the charge voltage in the capacitor with a predetermined reference voltage and outputting the timing signal according to the comparison result.

In addition, according to the present invention, there is provided a semiconductor memory comprising: a memory cell array having a memory cell; an address transition detector circuit for receiving address signals for selecting a memory cell of the memory cell array, detecting a switch of the address signals, and generating a pulse signal; a timing control circuit for generating first and second timing signals in response to the pulse signal generated by the address transition detector circuit; a data detector circuit whose operation is controlled based on the first timing signal generated by the timing control circuit, for detecting read-out data from the memory cell; a latch circuit whose operation is controlled based on the second timing signal generated by the timing control circuit, for latching data detected by the data detector circuit; and an output buffer circuit for receiving an output of the latch circuit and outputting data, wherein the timing control circuit receives the pulse signal generated by the address transition detector circuit; and generates the first timing signal to be supplied to the data detector circuit so that the data detector circuit operates during a predetermined period after the address signals have been switched, and after the detected data in the data detector circuit has been determined, the timing control circuit generates the second timing signal to be supplied to the latch circuit so that the latch circuit passes the detected data to be output to the output buffer circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram embodying a part of the pulse generator circuit shown in FIG. 6;

FIG. 8 is a timing chart showing an example of operation of the pulse generator circuit shown in FIG. 7;

FIG. 9 is a circuit diagram showing a detailed configuration of a reference voltage generator circuit shown in FIG. 3 and FIG. 6;

FIG. 10 is a circuit diagram showing a detailed configuration of a differential amplifier circuit in a BGR circuit shown in FIG. 9;

DETAILED DESCRIPTION OF THE INVENTION

Hereinafter, the present invention will be described with reference to the accompanying drawings by way of showing embodiments.

Figure 1:
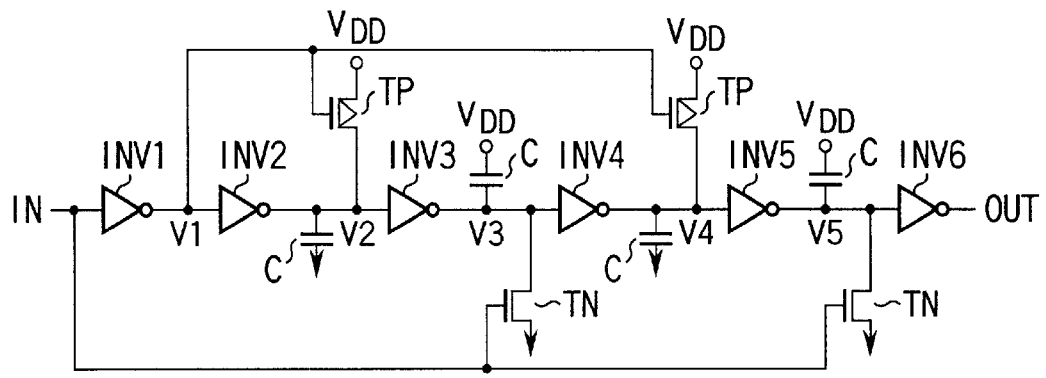
FIG. 1 is a circuit diagram showing a configuration of a conventional pulse generator circuit.
Figure 2:
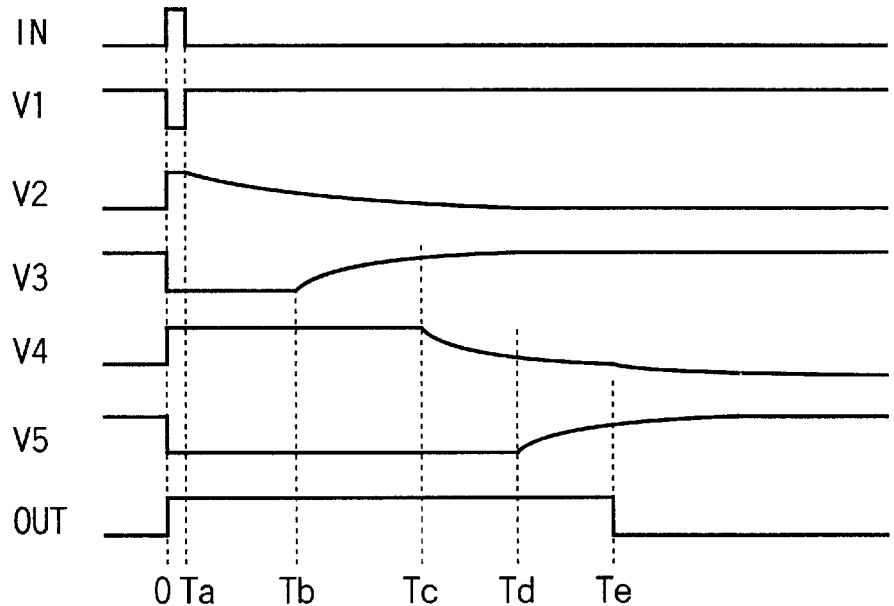
FIG. 2 is a timing chart showing an example of operation of the pulse generator circuit shown in FIG. 1.
Figure 3:
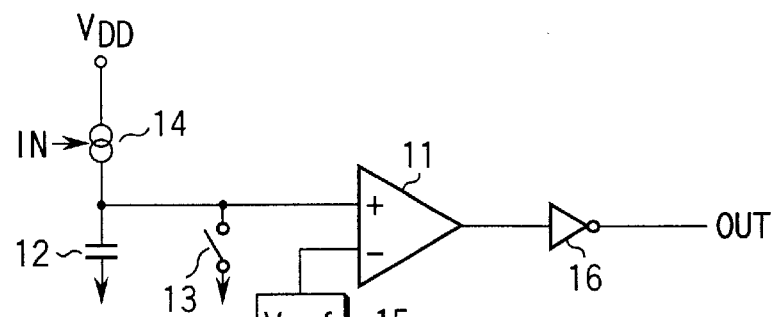
FIG. 3 is a circuit diagram showing a schematic configuration of the pulse generator circuit according to a first embodiment.

FIG. 3 shows a schematic configuration of a pulse generator circuit according to a first embodiment of the present invention.

A capacitor 12 is connected between a first input terminal (+) of a differential amplifier circuit (comparator circuit) 11 and a supply node of a ground voltage. Further, a switch circuit 13 is connected between the first input terminal (+) and the supply node of the ground voltage. Furthermore, a constant current source circuit (charge control circuit) 14 for charging the capacitor 12 at a constant current in response to an input signal (control signal) IN is connected between the supply node of a power voltage VDD and the first input terminal (+).

A constant reference voltage Vref generated by a reference voltage generator circuit 15 is supplied to a second input terminal (−) of the differential amplifier circuit 11. In addition, an inverter 16 is connected to an output terminal of the differential amplifier circuit 11, and a pulse signal OUT is output from this inverter 16.

In the thus configured pulse generator circuit, a switch circuit 13 is turned off before an input signal IN is supplied, i.e., when the input signal IN is at an L level. In addition, at this time, the capacitor 12 is charged to a power voltage VDD, an output signal of the differential amplifier circuit 11 is at an H level; and the output signal OUT of the inverter 16 is at an L level.

Next, when the input signal IN is supplied to a constant current source circuit 14, a constant current is output from this constant current source circuit 14. In addition, in the switch circuit 13, the input signal IN is turned on during an H level period. After the input signal IN has fallen into the L level, thereby causing the switch circuit 13 to be turned off, the capacitor 12 is charged by this constant current. A charge voltage of the capacitor 12 is compared with a reference voltage Vref by means of the differential amplifier circuit 11, its comparison result is inverted by means of the inverter 16, and the output signal OUT is obtained.

Here, a value of a current output from the constant current source circuit 14 is always constant independently of a value of the power voltage VDD, and does not change even if the power voltage varies. Therefore, every time the input signal IN is supplied, a charge voltage of the capacitor 12 exceeds the reference voltage Vref after its predetermined period of time, and a pulse signal OUT of an always constant pulse width is output from the inverter 16.

Figure 4:
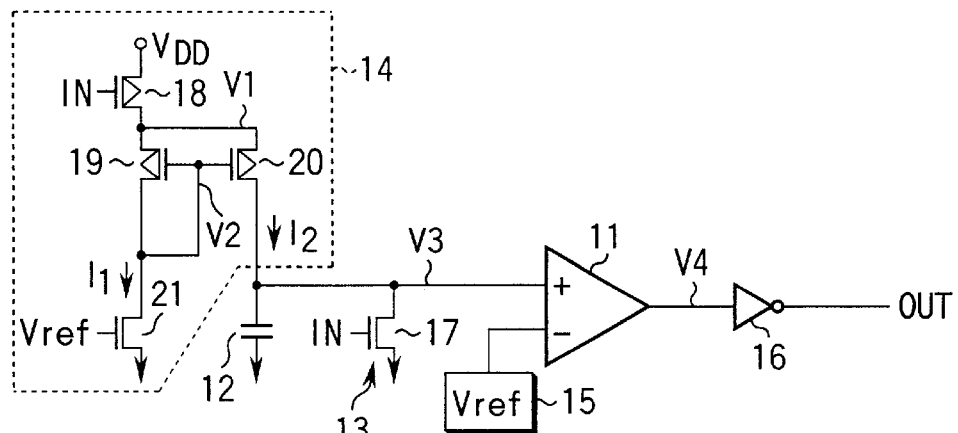
FIG. 4 is a circuit diagram embodying a part of the pulse generator circuit shown in FIG. 3.

FIG. 4 is a circuit diagram embodying a part of the pulse generator circuit shown in FIG. 3. As illustrated, the switch circuit 13 is composed of an N-channel transistor 17 in which a current path between a source and drain is connected between a first input terminal (+) of the differential amplifier circuit 11 and the supply node of the ground voltage, and the input signal IN is supplied to a gate.

The constant current source circuit 14 is composed of three P-channel transistors 18 to 20 and one N-channel transistor 21. A source of the P-channel transistor 18 is connected to the supply node of the power voltage VDD. Sources of two P-channel transistors 19 and 20 are connected to a drain of this transistor 18. Gates of these transistors 19 and 20 are connected in common, and the drain of the transistor 19 is connected to this gate common connection node. Further, a drain of the N-channel transistor 21 is connected to the drain of the transistor 19, and the source of this transistor 21 is connected to the supply node of the ground voltage. In addition, the reference voltage Vref is supplied to a gate of the transistor 21. The drain of the transistor 20 is connected to a common connection node between a first input terminal (+) of the differential amplifier circuit 11 and the capacitor 12.

That is, the constant current source circuit 14 supplies a current I1 according to the reference voltage Vref to the transistor 21 in which the reference voltage Vref is supplied to the gate, inputs this current I1 to the transistor 19 on the input side of two transistors 19 and 20 constituting a current mirror circuit, and supplies a current I2 from the transistor 20 on the output side, thereby charging the capacitor 12. The transistor 18 in the constant current source circuit 14 acts as a switch for supplying a current to the current mirror circuit or interrupting it therefrom in response to the input signal IN.

Figure 5:
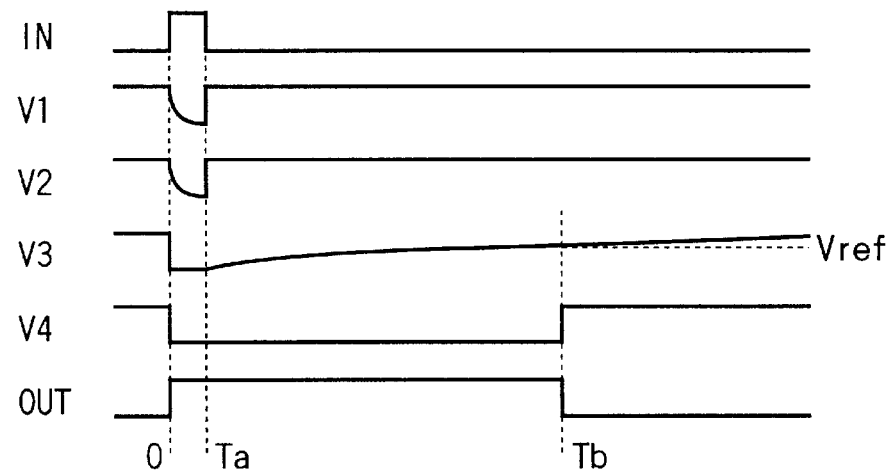
FIG. 5 is a timing chart showing an example of operation of the pulse generator circuit shown in FIG. 4.

FIG. 5 is a timing chart showing an example of operation of the pulse generator circuit shown in FIG. 4. In the figure, a signal at the source common connection node of the P-channel transistors 19 and 20 is designated by V1, a signal at the gate common connection node of the transistors 19 and 20 is designated by V2, a signal at the first input terminal (+) of the differential amplifier circuit 11, i.e., a charge signal of the capacitor 12 is designated by V3; and a signal at the output terminal of the differential amplifier circuit 11 is designated by V4.

Now, when the signal IN rises up to the H level at time 0, the N-channel transistor 17 is turned on, and the signal V3 is discharged to the L level. At this time, the signal V4 at the output terminal of the differential amplifier circuit 11 is at the L level, and the signal OUT being an output of the inverter 16 is at the H level.

Next, when the signal IN falls into the L level at a time Ta, the N-channel transistor 17 is turned off. Further, the P-channel transistor 18 is turned on, the constant current I1 according to the reference voltage Vref is supplied to the P-channel transistor 19, and the current I2 is supplied to the P-channel transistor 20. The capacitor 12 is then charged by this constant current I2.

Here, if the P-channel transistor 20 operates in a pentode tube area, the current I2 supplied to this transistor 20 is proportional to the current I1 supplied to the P-channel transistor 19 having a gate in common. For example, if channel widths of two transistors 19 and 20 are set to be equal to each other, I2 coincides with I1. Assuming that an absolute value of the threshold voltage is |VthP|, the condition under which the transistor 20 operates in the pentode tube area must meet:

$$V3 \leq V2 - |VthP| \qquad (1)$$

In addition, the reference voltage Vref is supplied to a gate of the N-channel transistor 21. If this transistor 21 operates in the pentode tube area, the current supplied to the transistor 21 becomes a constant current. Assuming that the threshold voltage is VthN, the condition under which the transistor 21 operates in the pentode-tube area must meet:

$$V2 \geq Vref - VthN \qquad (2)$$

A charge voltage of the capacitor 12 (signal V3) is compared with the reference voltage Vref by means of the differential amplifier circuit I1. The signal V4 of the output node of the differential amplifier circuit I1 is inverted to the H level at the time Tb at which a value of the signal V3 exceeds the reference voltage Vref. This signal V4 is inverted by means of the inverter 16, whereby the output signal OUT becomes at the L level, and a pulse period of the output signal OUT terminates.

Here, if the previous inequality formulas (1) and (2) are met, the value I2 of the current output from the constant current source circuit 14 is always constant independently of a value of the power voltage VDD. Every time the input signal IN is supplied, the charge voltage of the capacitor 12 exceeds the reference voltage Vref after a predetermined period of time, and a pulse signal OUT of the always constant pulse is output from the inverter 16.

In the meantime, in the pulse generator circuit shown in FIG. 3 and FIG. 4, the voltage value of the signal V3 is slightly greater than Vref at the time Tb shown in FIG. 3 at which the signal V4 is inverted to the H level, and the signal OUT is inverted into the L level. Therefore, a next-stage circuit (not shown) operates upon receipt of a change in the output signal OUT from this pulse generator circuit. This next-stage circuit operates, thereby causing a power supply noise to be generated. This power supply noise is transmitted to the differential amplifier circuit 11.

In general, a value of an external capacitance viewed from the first input terminal (+) of the differential amplifier circuit 11 is different from that of an external capacitance viewed from the second input terminal (−). Thus, the power supply noise is transmitted to the differential amplifier circuit 11, whereby there is a possibility that a relationship in scale between a voltage of the signal V3 and the reference voltage Vref is reversed. When this relationship in scale is reversed, a pulse circuit malfunctions.

Now, a pulse generator circuit according to a second embodiment of the present invention adopted to prevent malfunction due to the above mentioned power supply noise will be described here.

Figure 6:
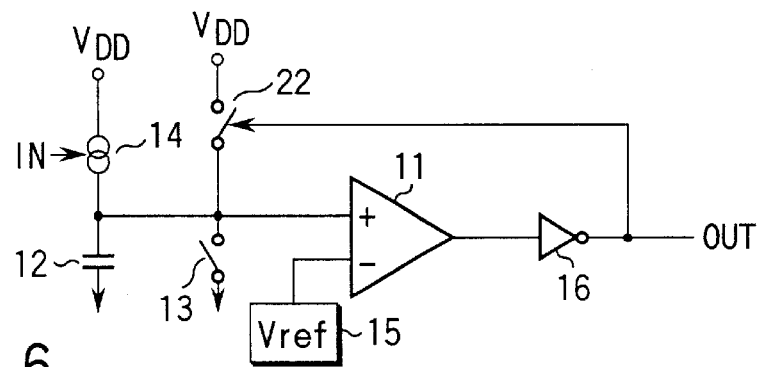
FIG. 6 is a circuit diagram showing a schematic configuration of the pulse generator circuit according to a second embodiment.

FIG. 6 shows a schematic configuration of the pulse generator circuit. The pulse generator circuit according to the illustrative embodiment is different from that shown in FIG. 3 in that a switch circuit 22 is newly connected between the supply node of the power voltage VDD and the first input terminal (+) of the differential amplifier circuit 11. The above switch circuit 22 is controlled for continuity by means of the pulse signal OUT output from the inverter 16.

FIG. 7 is a circuit diagram embodying a part of the pulse generator circuit shown in FIG. 6. As illustrated, the above switch circuit 22 is composed of a P-channel transistor 23 in which a current path between the source and the drain is connected between the supply node of the power voltage VDD and the first input terminal (+) of the differential amplifier circuit 11, and the output signal OUT from the inverter 16 is supplied to the gate.

FIG. 8 is a timing chart showing an example of operation of the pulse generator circuit shown in FIG. 7. As is the case with FIG. 5, a signal at the source common connection node of the P-channel transistors 19 and 20 is designated by V1; a signal at the gate common connection node of the transistors 19 and 20 is designated by V2; a signal at the first input terminal (+) of the differential amplifier circuit 11 is designated by V3; and a signal at the output terminal of the differential amplifier circuit 11 is designated by V4.

In FIG. 8, the input signal IN is input, whereby causing the capacitor 12 to be charged, and a value of the signal V3 exceeds the reference voltage Vref at the time Tb, whereby causing the signal V4 of the output node of the differential amplifier circuit 11 to be inverted to the H level. Thereafter, this signal V4 is inverted by means of the inverter 16, causing the output signal OUT to be at the L level, and the pulse period of the output signal OUT terminates. These operations are the same as those shown in FIG. 5.

In the illustrative embodiment, after the output signal OUT has been inverted to the L level, the P-channel transistor 23 becomes conductive. In this manner, a voltage value of the signal V3 close to the reference voltage Vref at the time Tb is set to the power voltage VDD which is sufficiently greater than Vref.

As a result, a next-stage circuit (not shown) operates upon receipt of a change in the output signal OUT from this pulse generator circuit. This next-stage circuit operates, thereby causing a power supply noise to be generated. Even if this power supply noise is transmitted to the differential amplifier circuit 11, the voltage of the signal V3 is sufficiently higher than the reference voltage Vref, and thus, the output signal V4 of the differential amplifier circuit 11 is prevented from being inverted by influence of the power supply noise.

In the above transistor 23, the input signal IN is then input, the transistor 13 is turned on, and the output signal V4 of the differential amplifier circuit 11 is inverted to the L level. Further, the output signal OUT of the inverter 16 is inverted to the H level, and then, the transistor is set to its original OFF state.

FIG. 9 shows a detailed circuit configuration of the reference voltage generator circuit 15 employed in the pulse generator circuit according to the first and second embodiments. This reference voltage generator circuit is well known as a Band Gap Reference circuit (hereinafter, referred to as a "BGR" circuit). This circuit comprises: a P-channel transistor 31 in which a current path between a source and a drain is inserted between the supply node of the power voltage VDD and the output node of the reference voltage Vref; a resistor 32 and one diode 33 connected in series between the output node of the reference voltage Vref and the supply node of the ground voltage; two resistors 34 and 35 and N-number of diodes 36-1, . . . 36-N (N denotes a positive integer) connected in series between the output node of the reference voltage Vref and the supply node of the ground voltage; and a differential amplifier circuit 39 having a first input terminal (+) and a second input terminal (−). The first terminal (+) of the circuit 39 is connected to receive a voltage Va from a node 37 of the resistor 32 and diode 33 which are connected in series. The second input terminal (−) of the circuit 39 is connected to receive a voltage Vb from a node 38 of the two resistors 34 and 35 which are connected in series.

An MOS transistor diode-connected may be used in place of the each of the diodes 33, 36-1 . . . 36-N.

In the thus configured circuit, a value of the reference voltage Vref obtained enters a stable state when a voltage Va of a node 37 coincides with a voltage Vb of a node 38. When resistance values of the resistors 34 and 35 are designated by R1 and R2, and a voltage of serial connection node between the resistor 35 and the diode 36-1 is designated by Vc, a value of the reference voltage Vref is obtained by the formula below.

$$Vref = Va + (R1/R2) \times (Va - Vc) \quad (3)$$

When the forward drop voltage of each diode is designated by Vf, Va corresponds to Vf, and Vc corresponds to N×Vf.

Therefore, the reference voltage Vref given by the above formula (3) does not have power voltage dependency, and is obtained as a constant value according to a resistance ratio between the registers 34 and 35 and N-number of diodes 36-1, . . . 36-N.

FIG. 10 shows a detailed circuit configuration of the differential amplifier circuit 39 in the BGR circuit shown in FIG. 9. This circuit is composed of two P-channel transistors 41 and 42 and three N-channel transistors 43, 44, and 45. Each of the gates of the N-channel transistors 43 and 44 corresponds to a first input terminal (+) and a second input terminal (−), and a common drain of the P-channel transistor 42 and the N-channel transistor 44 correspond to an output terminal.

In the thus configured differential amplifier circuit, when a potential of the gate of the N-channel transistor 43 is higher than that of the gate of the N-channel transistor 44, the output signal OUT enters the H level close to the power voltage VDD. Conversely, when the potential of the gate of the N-channel transistor 43 is lower than that of the gate of the N-channel transistor 44, the output signal OUT enters the L level close to the ground voltage. Further, when the potentials of the N-channel transistors 43 and 44 are substantially equal, the output signal OUT has a potential substantially equal to the potential at the gate common connection node of the P-channel transistors 41 and 42.

In general, the P-channel transistors 41 and 42 of the substantially same size in channel width and channel length are used, and the N-channel transistors 43 and 44 of the substantially same size in channel width and channel length are used.

Figure 11:
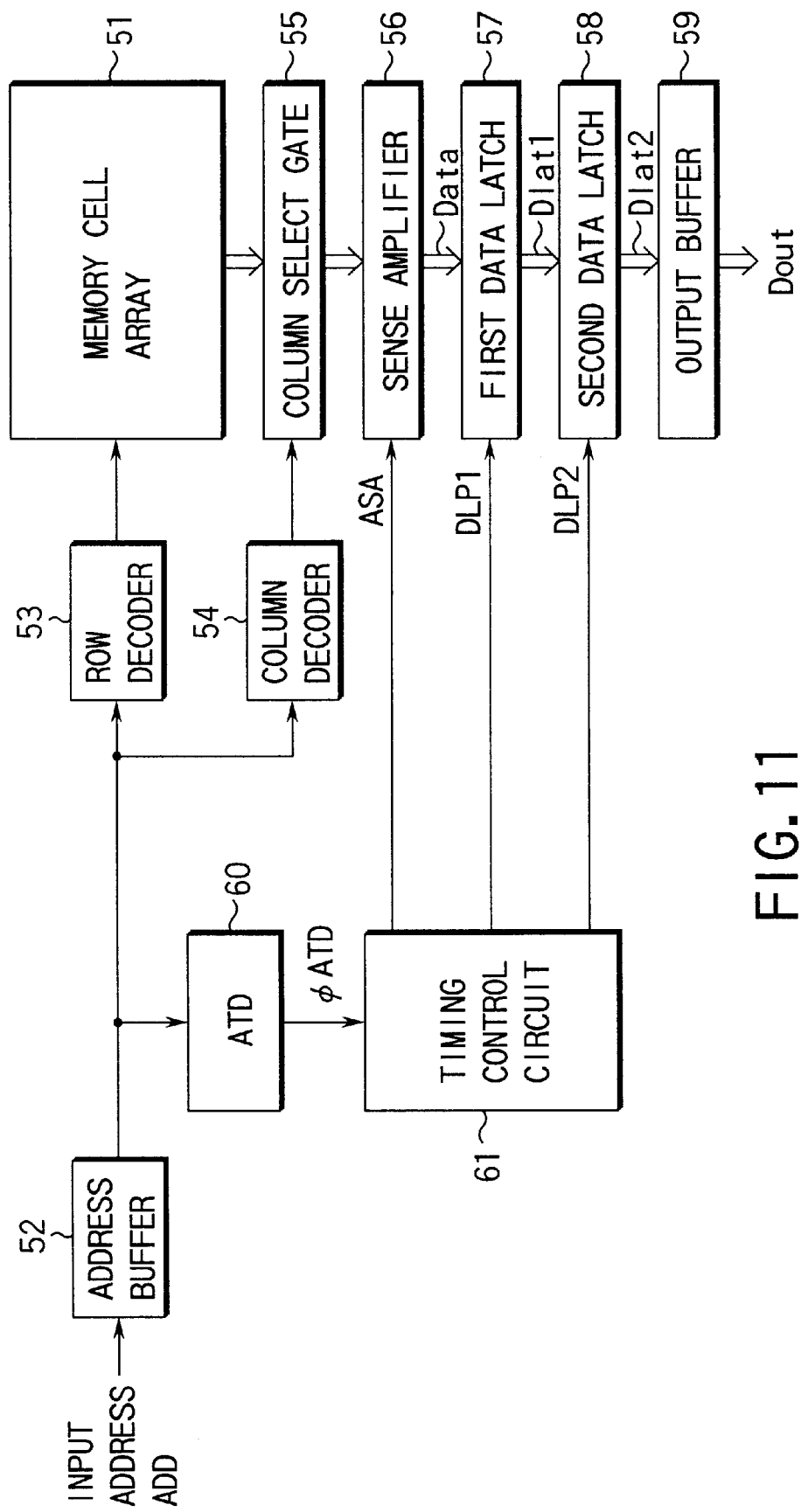
FIG. 11 is a block diagram showing a semiconductor memory according to the first embodiment.

FIG. 11 is a block diagram showing a configuration of a semiconductor memory comprising the pulse generator circuit shown in FIG. 3 and FIG. 4 or FIG. 6 and FIG. 7 according to the first embodiment of the present invention. In FIG. 11, there is shown only a configuration of a data read-out circuit, and there is not shown a configuration of a writing circuit.

In FIG. 11, a memory cell array 51 is provided with a plurality of memory cells (not shown). In addition, a plurality of word lines and bit lines (not shown) are provided, respectively, in the memory cell array 51.

An address buffer 52 buffer-amplifies address signals ADD input from the outside of memory, and outputs internal address signals. The internal address signals output from the address buffer 52 are supplied to a row decoder 53 and a column decoder 54.

The row decoder 53 selectively drives a word line in the memory cell array 51 based on the internal address signals output from the address buffer 52. The column decoder 54 controls a column select gate circuit 55 based on the internal address signals output from the address buffer 52. This column select gate circuit 55 selects a column (bit line) of the memory cell array 51 according to the decoded output from the column decoder 54. A sense amplifier 56 is connected to the column select gate circuit 55.

The sense amplifier 56 is activated and controlled by means of a timing signal ASA. While in an active state, the sense amplifier 56 amplifies a potential difference generated at the bit line selected by the column select gate circuit 55, and senses read-out data. The data sensed by the sense amplifier 56 is supplied to a first data latch circuit 57. An operation of the first data latch circuit 57 is controlled based on a timing signal DLP1, and the sensed data by the sense amplifier 56 is passed as it is or is latched. An output of the first data latch circuit 57 is supplied to a second data latch circuit 58. An operation of the second data latch circuit 58 is controlled based on a timing signal DLP2, and the output of the first data latch circuit 57 is passed as it is or is latched. An output of the second data latch circuit 58 is output as read-out data Dout to the outside of memory via an output buffer 59.

On the other hand, the internal address signal output from the address buffer 52 is also supplied to an address transition director circuit 60 (Hereinafter, referred to as ATD). The ATD 60 detects a transition of internal address signals (i.e., equivalent to a transition of external address signals), and generates a pulse signal DATD. This pulse signal ΦATD is supplied to a timing control circuit 61.

The timing control circuit 61 generates various timing signals for controlling operation of various circuits in the semiconductor memory including a timing signal ASA for controlling activation of the sense amplifier 56 in response to the pulse signal ΦATD generated by the ATD 60; a timing DLP1 for controlling operation of the first data latch circuit 57; and a timing DLP2 for controlling operation of the second data latch circuit 58.

Here, the above timing control circuit 61 is provided with a plurality of pulse generator circuits for generating various timing signals as shown in FIG. 3 and FIG. 4 or FIG. 6 and FIG. 7.

Figure 12:
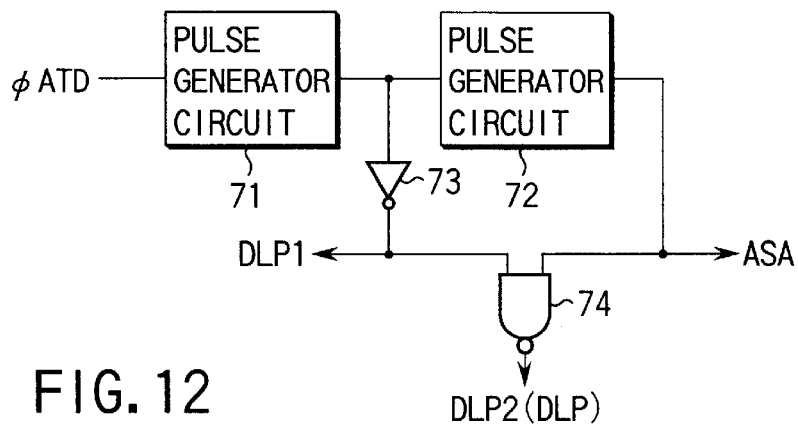
FIG. 12 is a circuit diagram showing an example of a timing control circuit in the semiconductor memory shown in FIG. 11.

FIG. 12 is a circuit diagram extracting and showing a circuit portion for generating the above timing signals ASA, DLP1, and DLP2 in the above timing control circuit 61. Here, two pulse generator circuits 71 and 72 each having a circuit configuration similar to those shown in FIG. 3 and FIG. 4 or FIG. 6 and FIG. 7 are provided. The pulse signal (ATD generated by the ATD 60 is input to one pulse generator circuit 71. FIG. 12 is a circuit diagram extracting and showing a circuit portion for generating the above timing signals ASA, DLP1, and DLP2 in the above timing control circuit 61. This circuit portion is provided with two pulse generating circuits 71, 72 each having a circuit configuration similar to that shown in FIGS. 1 and 2, or FIGS. 4 and 5. A pulse signal ΦATD generated at the ATD 60 is input to one pulse generator circuit 71. An output of the pulse generating circuit 71 is input to the other pulse generating circuit 72 and is inverted by an inverter 73, and a timing signal DLP1 for controlling operation of the first data latch circuit 57 is output from the inverter 73. Also, a timing signal ASA for performing activation control on the sense amplifier 56 is output from the pulse generating circuit 72. Both the timing signal DLP1 and ASA are input to a NAND circuit 74, and a timing signal DLP2 for controlling operation of the second data latch circuit 58 is output from the NAND circuit 74.

Figure 13:
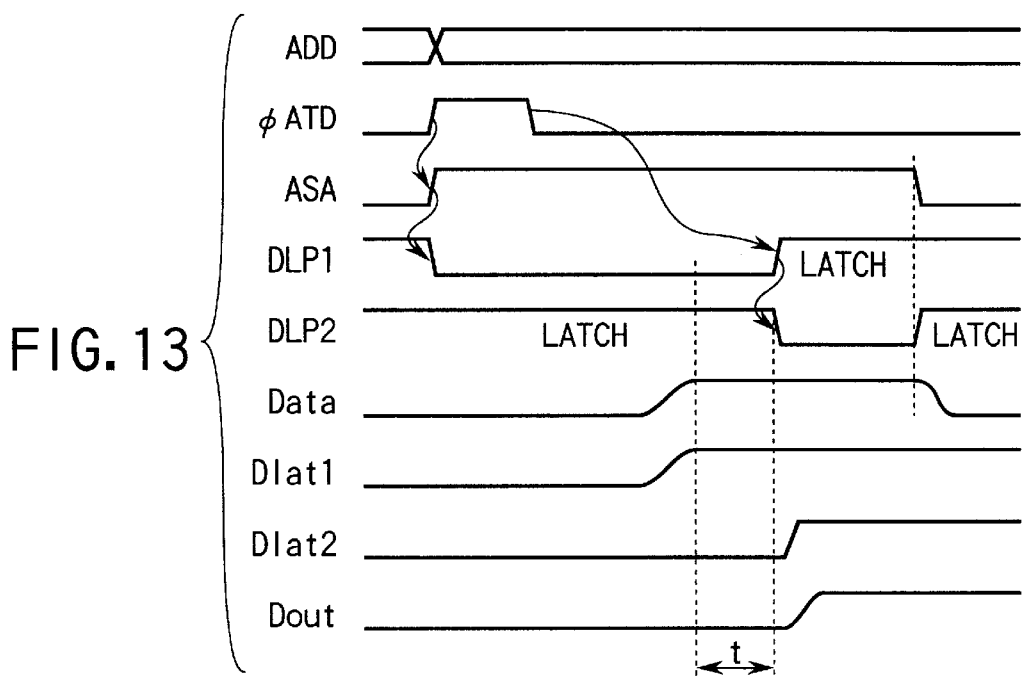
FIG. 13 is a timing chart showing an example of operation of the semiconductor memory shown in FIG. 11.

FIG. 13 is a timing chart showing an operation of a semiconductor memory having its configuration as shown in FIG. 11. When an address signal ADD input from the outside of memory is switched, the pulse signal ΦATD is output from the ATD 60 upon receipt of this switching. Further, upon the receipt of this pulse signal ΦATD, the timing control circuit 61 generates various timing signals. First, the timing signal ASA output from a pulse generator circuit 72 shown in FIG. 10 rises up to the H level. In this manner, the sense amplifier 56 is activated, and the sensing of memory cell data read out in advance to a selected bit line by a column select gate circuit 55 is started.

In addition, after the timing signal ASA has been risen to the H level, a signal output from the pulse generator circuit 71 shown in FIG. 10 rises up to the H level. Thus, the timing signal DLP1 obtained as an output of the inverter 73 falls down to the L level. When the signal DLP1 is at the L level, the latch state of the first data latch circuit 57 is released, and the sensed data by the sense amplifier 56 is passed. On the other hand, at this time, the second data latch circuit 58 latches the previous sensed data by the sense amplifier 56.

Next, after the sense amplifier 56 has been activated, thereby causing the sense data to be determined (designated as a rise of data in FIG. 11), a signal output from the pulse generator circuit 71 falls into the L level, and the timing signal DLP1 rises up to the H level. In this manner, the first data latch circuit 57 enters a latch state, and the determined sense data is latched by this first data latch circuit 57 (designated as Dlat1 in FIG. 13). After the timing signal DLP1 has been risen up to the H level, the timing signal DLP2 being an output of the NAND circuit 74 falls into the L level, whereby the latch state of the second data latch circuit 58 is released, and the data latched by the first data latch circuit 57 is output (designated as Dlat2 in FIG. 13). The data Dlat2 is input to the output buffer 59, and the read-out data Dout is output to the outside of memory.

Here, after the data has been read-out, if an address is not switched within a predetermined period of time, the timing signal ASA falls into the L level at a predetermined timing, and the sense amplifier 56 enters an inactive state. Further, the timing signal DLP2 is at the H level, and the second data latch circuit 58 enters a latch state. In this manner, the sense amplifier 56 is powered down so that a wasteful current is not consumed by the sense amplifier 56.

In such semiconductor memory, a data access speed is substantially determined depending on a timing period of the timing signals ASA, DLP1, and DLP2. Therefore, minimizing power voltage dependency of the output pulse widths of the above pulse generator circuits 71 and 72 leads to improved semiconductor memory performance. In the embodied semiconductor memory, there are employed pulse generator circuits 71 and 72 that do not have power voltage dependency of the output pulse widths, as shown in FIG. 6 and FIG. 7. A timing period of the timing signals ASA, DLP1, and DLP2 can be minimized without considering variation in power voltage, thus making it possible to speed up data access.

On the other hand, a mass current is supplied to the sense amplifier 56 during a sensing period. In addition, the power consumption in the sense amplifier 56 is relatively large among the internal circuit of the semiconductor memory.

In general, the power voltage dependency of an operating speed of the sense amplifier does not match the power voltage dependency of the pulse width of a control signal for controlling operation of the sense amplifier generated by the timing control circuit. Therefore, conventionally, the pulse width of this control signal is wastefully lengthened to cope with variation in power supply.

However, in this embodied semiconductor memory, there is employed the pulse generator circuits 71 and 72 in the timing control circuit 61, which do not have power voltage dependency in pulse width. There is no need for wastefully lengthening the pulse width of the timing signal ASA for controlling operation of the sense amplifier, thus making it possible to reduce the power consumption in the sense amplifier 56.

However, in the semiconductor memory shown in FIG. 11, the sense data 'Data' of the sense amplifier 56 is latched by means of the first and second data latch circuits 57 and 58, and is output to the outside. Thus, if a timing of data sensing in the sense amplifier 56 and a timing of latching in the first data latch circuit 57 are shifted, valid data is not supplied to the second data latch circuit 58, and the valid data may not be output. Therefore, in order to prevent this situation even if a dispersion in manufacturing process occurs, the sense data is determined by means of the sense amplifier 56. Further, it is necessary to configure the timing control circuit 61 so that the timing signal DLP1 rises with a sufficient time margin ('t' in FIG. 13).

In addition, the pulse widths in two pulse generator circuits 71 and 72 shown in FIG. 12 can be set by a value of the reference voltage Vref.

Figure 14:
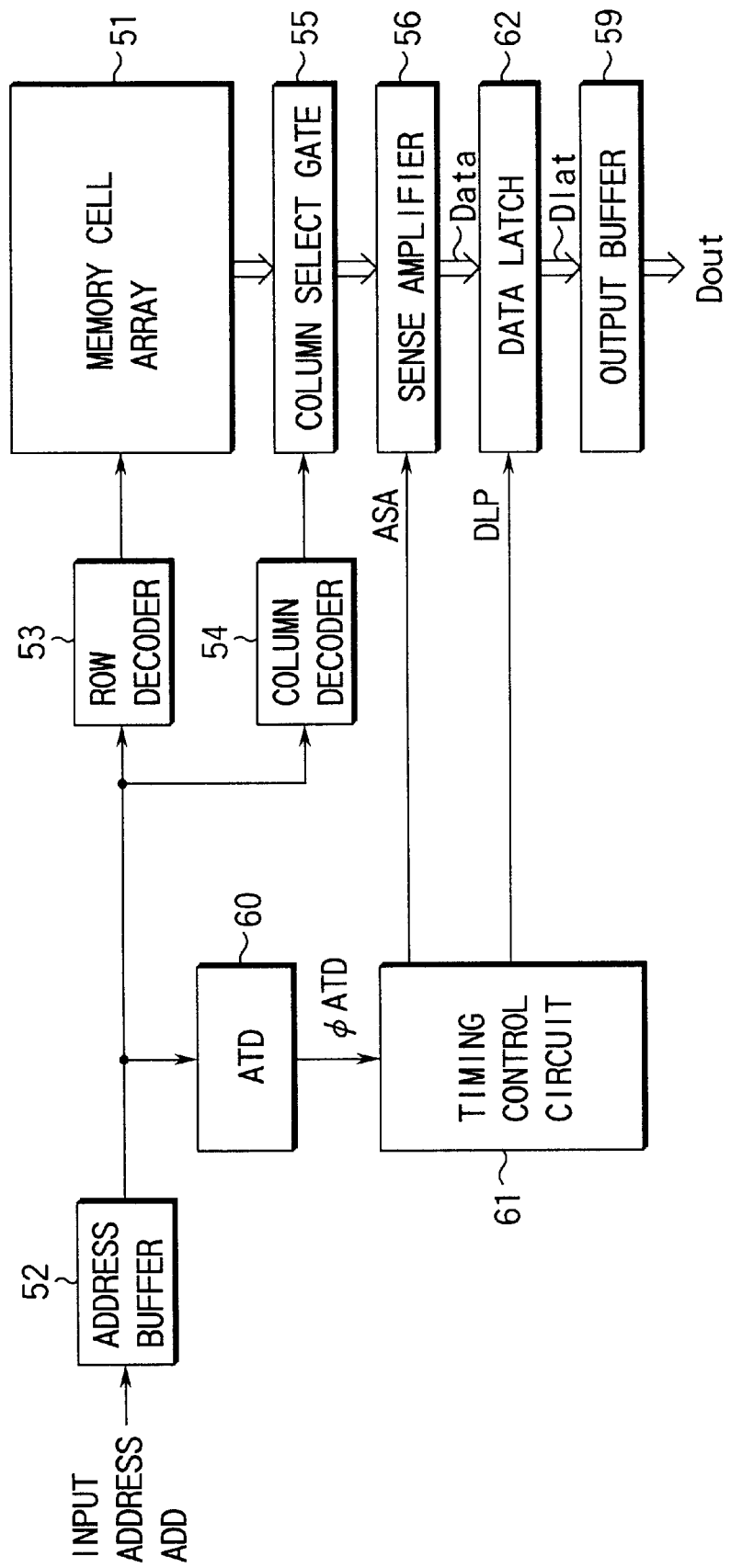
FIG. 14 is a block diagram showing a semiconductor memory according to a second embodiment.

FIG. 14 is a block diagram showing a configuration of a semiconductor memory comprising the pulse generator circuit shown in FIG. 3 and FIG. 4 or FIG. 6 and FIG. 7 according to the second embodiment of the present invention. In this case also, as in the case with FIG. 11, only a configuration of the data read-out circuit is shown, and a configuration of a writing circuit is not shown.

This semiconductor memory is different from that shown in FIG. 11 in that only one data latch circuit 62 is provided instead of providing the first and second data latch circuits 57 and 58 shown in FIG. 11. An operation of this data latch circuit 62 is controlled by means of a timing signal DLP generated by the timing control circuit 61.

The above timing signal DLP may be same as the signal DLP2 output from the NAND circuit 74 in the timing control circuit 61 shown in FIG. 12.

Figure 15:
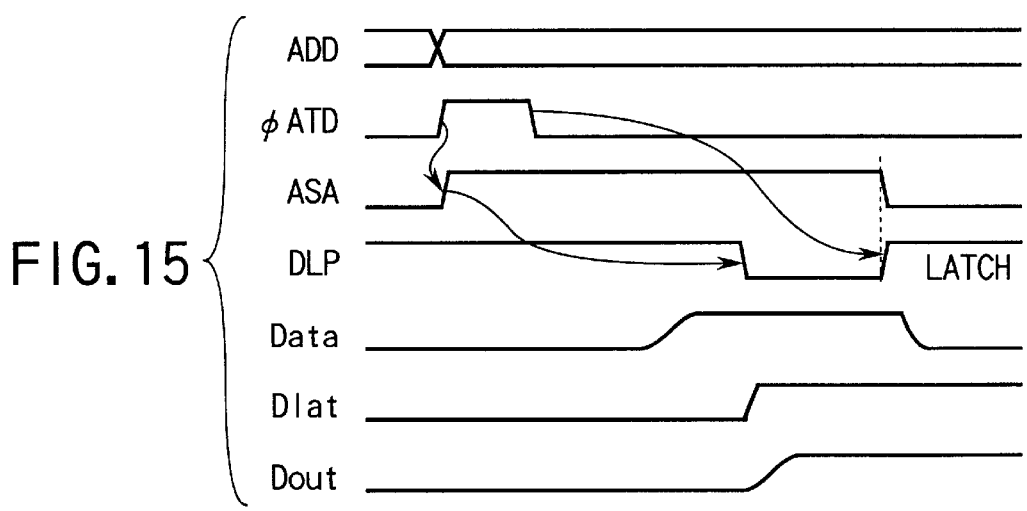
FIG. 15 is a circuit diagram showing an example of the timing control circuit in the semiconductor memory shown in FIG. 14.

FIG. 15 is a timing chart showing an example of operation of the semiconductor memory shown in FIG. 14. In the figure, Dlat designates an output of the data latch circuit 62.

In the case of the illustrative embodiment also, after data has been read-out, if an address is not switched within a predetermined period of time, the timing signal ASA falls into the L level at a predetermined timing, and the sense amplifier 56 enters an inactive state. Further, the timing signal DLP is at the H level, and the data latch circuit 62 enters a latch state. In this manner, the sense amplifier 56 is powered down so that a wasteful current is not consumed by the sense amplifier 56.

Further, in the illustrative embodiment, after the sense data in the sense amplifier 56 has been determined, the data latch circuit 62 enters a through state (release of the latch state), and the data is output. Thus, even if the data sensing timing and the latch timing are shifted, the data can be output.

As has been described above, according to the present invention, there can be provided a pulse generator circuit capable of outputting a pulse signal having an always constant pulse width without power voltage dependency and a semiconductor memory provided with this pulse generator circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pulse generator circuit comprising:

a capacitor in which charging is performed;

a charge control circuit for charging the capacitor at a constant current in response to a control signal;

a comparator circuit for comparing a charge voltage in the capacitor with a reference voltage and outputting a pulse signal based on the comparison result; and a first voltage setting circuit for forcibly setting a charge voltage in the capacitor to a voltage higher than the reference voltage in response to the pulse signal.

2. The pulse generator circuit according to claim 1, further comprising a second voltage setting circuit for forcibly setting a charge voltage in the capacitor to a voltage lower than the reference voltage in response to the control signal.

3. The pulse generator circuit according to claim 1, wherein the comparator circuit has a first and second input terminals, and is a differential amplifier circuit in which a charge voltage in the capacitor is supplied to the first input terminal, and the reference voltage is supplied to the second input terminal.

4. The pulse generator circuit according to claim 1, further comprising a reference voltage circuit for generating the reference voltage.

5. The pulse generator circuit according to claim 4, wherein the reference voltage generator circuit is a band cap type reference voltage generator circuit.

6. The pulse generator circuit according to claim 1, wherein the charge control circuit is configured so as to receive the reference voltage and generate a constant current value according to this reference voltage.

* * * * *